United States Patent
Ohmori et al.

(10) Patent No.: US 10,964,366 B2
(45) Date of Patent: Mar. 30, 2021

(54) MAGNETIC MEMORY, RECORDING METHOD OF MAGNETIC MEMORY, AND READING METHOD OF MAGNETIC MEMORY

(71) Applicant: SONY SEMICONDUCTOR SOLUTIONS CORPORATION, Kanagawa (JP)

(72) Inventors: Hiroyuki Ohmori, Kanagawa (JP); Masanori Hosomi, Tokyo (JP); Yutaka Higo, Kanagawa (JP); Hiroyuki Uchida, Kanagawa (JP); Naoki Hase, Tokyo (JP); Yo Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/490,142

(22) PCT Filed: Jan. 5, 2018

(86) PCT No.: PCT/JP2018/000110
§ 371 (c)(1),
(2) Date: Aug. 30, 2019

(87) PCT Pub. No.: WO2018/163583
PCT Pub. Date: Sep. 13, 2018

(65) Prior Publication Data
US 2020/0013443 A1    Jan. 9, 2020

(30) Foreign Application Priority Data

Mar. 9, 2017   (JP) ............................. JP2017-044678

(51) Int. Cl.
G11C 11/16 (2006.01)
H01L 27/22 (2006.01)
H01L 43/08 (2006.01)

(52) U.S. Cl.
CPC ........ *G11C 11/161* (2013.01); *G11C 11/1655* (2013.01); *G11C 11/1657* (2013.01);
(Continued)

(58) Field of Classification Search
CPC .................... G11C 11/161; G11C 11/1673; G11C 11/1675
(Continued)

(56) References Cited

U.S. PATENT DOCUMENTS 6,584,011 B2 *   6/2003   Watanabe .............. B82Y 10/00
                                                 365/158
6,697,294 B1 *   2/2004   Qi .......................... G11C 11/16
                                                 365/158
(Continued)

FOREIGN PATENT DOCUMENTS

CN   102983272 A   3/2013
CN   104620319 A   5/2015
(Continued)

OTHER PUBLICATIONS

International Search Report and Written Opinion of PCT Application No. PCT/JP2018/000110, dated Mar. 13, 2018, 11 pages of ISRWO.

*Primary Examiner* — Son L Mai
(74) *Attorney, Agent, or Firm* — Chip Law Group

(57) ABSTRACT

There is provided a magnetic memory that can suppress the increase in manufacturing costs while recording multivalued information in one memory cell, the memory including first and second tunnel junction elements each having a laminated structure including a reference layer with a fixed magnetization direction, a recording layer with a reversible
(Continued)

magnetization direction, and an insulating layer sandwiched between the reference layer and the recording layer, a first selection transistor electrically connected to first ends of the first and second tunnel junction elements, a first wire electrically connected to a second end of the first tunnel junction element, and a second wire electrically connected to a second end of the second tunnel junction element.

11 Claims, 8 Drawing Sheets

(52) U.S. Cl.
CPC ...... *G11C 11/1673* (2013.01); *G11C 11/1675* (2013.01); *H01L 27/228* (2013.01); *H01L 43/08* (2013.01)

(58) Field of Classification Search
USPC .................................................. 365/158, 171
See application file for complete search history.

(56) References Cited

U.S. PATENT DOCUMENTS

| | | | | |
|---|---|---|---|---|
| 6,757,189 | B2 * | 6/2004 | Hung | G11C 11/16 365/158 |
| 7,064,970 | B2 * | 6/2006 | Nazarian | G11C 13/0014 365/46 |
| 7,166,881 | B2 * | 1/2007 | Lin | G11C 11/15 257/295 |
| 7,245,522 | B2 * | 7/2007 | Aoki | G11C 11/16 365/158 |
| 7,548,450 | B2 * | 6/2009 | Aoki | G11C 11/16 365/158 |
| 7,577,019 | B2 * | 8/2009 | Hung | G11C 11/16 365/158 |
| 8,767,446 | B2 * | 7/2014 | Hu | G11C 11/1673 365/158 |
| 9,165,631 | B2 | 10/2015 | Kim et al. | |
| 2004/0047204 | A1 | 3/2004 | Hung et al. | |
| 2008/0277703 | A1 | 11/2008 | Iwayama | |
| 2012/0134200 | A1 * | 5/2012 | Khoueir | G11C 11/1675 365/158 |
| 2013/0058161 | A1 | 3/2013 | Yamanaka et al. | |
| 2014/0071740 | A1 | 3/2014 | Kim et al. | |

FOREIGN PATENT DOCUMENTS

| | | |
|---|---|---|
| JP | 2004-171729 A | 6/2004 |
| JP | 2007-258533 A | 10/2007 |
| JP | 2008-277542 A | 11/2008 |
| JP | 2012-142418 A | 7/2012 |
| JP | 2013-058522 A | 3/2013 |
| JP | 2015-534204 A | 11/2015 |
| TW | 578149 B | 3/2004 |
| TW | 201312560 A | 3/2013 |
| WO | 2014/043575 A1 | 3/2014 |

\* cited by examiner

MAGNETIC MEMORY, RECORDING METHOD OF MAGNETIC MEMORY, AND READING METHOD OF MAGNETIC MEMORY

CROSS REFERENCE TO RELATED APPLICATIONS

This application is a U.S. National Phase of International Patent Application No. PCT/JP2018/000110 filed on Jan. 5, 2018, which claims priority benefit of Japanese Patent Application No. JP 2017-044678 filed in the Japan Patent Office on Mar. 9, 2017. Each of the above-referenced applications is hereby incorporated herein by reference in its entirety.

TECHNICAL FIELD

The present disclosure relates to a magnetic memory, a recording method of the magnetic memory, and a reading method of the magnetic memory.

BACKGROUND ART

With the tremendous development of various information devices from large-capacity servers to mobile terminals, higher performance, such as higher integration, higher speed, lower power consumption, and the like has been pursued in elements constituting the information devices such as memory and logic elements. In particular, the progress of a nonvolatile semiconductor memory is remarkable, and for example, a flash memory serving as a large-capacity file memory has come into wide use at a rate expelling hard disk drives. Meanwhile, with usage for code storage and further application to working memories in view, in order to replace currently generally used NOR flash memories, dynamic random access memories (DRAM), and the like, various types of semiconductor memory have been developed such as a ferroelectric random access memory (FeRAM), magnetic random access memory (MRAM), and phase-change random access memory (PCRAM). Note that some of these memories have already been put into practical use.

The MRAM, which is one of the memories described above, records information by using a change in electric resistance of a memory element by reversing a magnetization direction of a magnetic body of the memory element included in the MRAM. Consequently, it is possible to read the recorded information by determining a resistance state of the memory element determined by the reversal of the magnetization direction, in more detail, the magnitude of the electric resistance of the memory element. Such an MRAM can operate at high speed, can be rewritten almost infinitely ($10^{15}$ times or more), and has high reliability, therefore the MRAM is already used in fields such as industrial automation and aircraft. Moreover, the MRAM is expected to expand into code storage and working memory in the future because of its high-speed operation and high reliability.

Moreover, of the MRAM, greater expectations are placed on the MRAM that reverses the magnetization direction of the magnetic body by using spin torque magnetization reversal because low power consumption and high capacity can be achieved while having the above advantages such as high-speed operation. Note that such an MRAM using spin torque magnetization reversal is called spin transfer torque-magnetic random access memory (STT-MRAM) (spin injection type MRAM) (see, for example, Non-patent Documents 1 and 2).

Furthermore, as a method of further increasing recording density of the MRAM, it is examined to record multivalued information in each memory cell. For example, Patent Document 1 below discloses a magnetic memory in which two tunnel junction elements (also called magnetic tunnel junction (MTJ) elements) are provided in one memory cell and multivalued information is recorded in one memory cell. In more detail, in Patent Document 1, one memory cell includes two MTJ elements connected in parallel to each other and one selection transistor connected thereto. In such a configuration, in order to record information selectively in one of the MTJ elements in the memory cell or to distinguish and read the information recorded in each MTJ element, magnetic characteristics of two MTJ elements (reversal current, element resistance value, and the like) are different from each other. More specifically, in Patent Document 1, two MTJ elements have laminated structures different from each other.

CITATION LIST

Patent Document

Patent Document 1: Japanese Patent Application Laid-Open No. 2008-277542

Non-Patent Document

Non-patent Document 1: Physical Review b, 54, 9353(1996)
Non-patent Document 2: Journal of Magnetism and Magnetic Materials, 159, L1(1996)

SUMMARY OF THE INVENTION

Problems to be Solved by the Invention

In Patent Document 1, as described above, in order to make the magnetic characteristics of two MTJ elements included in one memory cell different from each other, two MTJ elements having laminated structures different from each other are formed. However, with the technique disclosed in Patent Document 1, different laminated structures are produced separately, leading to an increase in the number of processes for manufacturing the magnetic memory, and as a result, it is difficult to suppress the increase in manufacturing costs of the magnetic memory.

Therefore, the present disclosure proposes a novel, improved magnetic memory, a recording method of the magnetic memory, and a reading method of the magnetic memory that can suppress the increase in manufacturing costs while recording multivalued information in one memory cell.

Solutions to Problems

The present disclosure provides a magnetic memory including: first and second tunnel junction elements each having a laminated structure including a reference layer with a fixed magnetization direction, a recording layer with a reversible magnetization direction, and an insulating layer sandwiched between the reference layer and the recording layer; a first selection transistor electrically connected to first ends of the first and second tunnel junction elements; a first wire electrically connected to a second end of the first tunnel junction element; and a second wire electrically connected to a second end of the second tunnel junction element.

Furthermore, the present disclosure provides a magnetic memory including a plurality of memory cells arranged in a matrix, in which each of the memory cells includes: a plurality of tunnel junction elements each having a laminated structure including a reference layer with a fixed magnetization direction, a recording layer with a reversible magnetization direction, and an insulating layer sandwiched between the reference layer and the recording layer; a selection transistor electrically connected to first ends of the plurality of tunnel junction elements; and a plurality of wires electrically connected to a second end of each of the tunnel junction elements.

Furthermore, the present disclosure provides a recording method of a magnetic memory, the magnetic memory including: first and second tunnel junction elements each having a laminated structure including a reference layer with a fixed magnetization direction, a recording layer with a reversible magnetization direction, and an insulating layer sandwiched between the reference layer and the recording layer; a selection transistor electrically connected to first ends of the first and second tunnel junction elements; a first wire electrically connected to a second end of the first tunnel junction element; and a second wire electrically connected to a second end of the second tunnel junction element, the recording method including: bringing the selection transistor into a conductive state; and providing a potential difference between the first wire and the second wire.

Furthermore, the present disclosure provides a recording method of a magnetic memory, the magnetic memory including a plurality of memory cells arranged in a matrix, each of the memory cells including: a plurality of tunnel junction elements each having a laminated structure including a reference layer with a fixed magnetization direction, a recording layer with a reversible magnetization direction, and an insulating layer sandwiched between the reference layer and the recording layer; a selection transistor electrically connected to first ends of the plurality of tunnel junction elements; and a plurality of wires electrically connected to second ends of the tunnel junction elements, the recording method including, in the memory cells: bringing the selection transistor into a conductive state; and providing a potential difference between the plurality of wires.

Moreover, the present disclosure provides a reading method of a magnetic memory, the magnetic memory including: first and second tunnel junction elements each having a laminated structure including a reference layer with a fixed magnetization direction, a recording layer with a reversible magnetization direction, and an insulating layer sandwiched between the reference layer and the recording layer; a selection transistor electrically connected to first ends of the first and second tunnel junction elements; a first wire electrically connected to a second end of the first tunnel junction element; a second wire electrically connected to a second end of the second tunnel junction element; and a third wire electrically connected to an opposite side of the selection transistor from the first and second tunnel junction elements, the reading method including: bringing the selection transistor into a conductive state; applying a voltage to the first and second wires such that the third wire has a first polarity; then applying a voltage to the first wire or the second wire such that the third wire has a second polarity opposite to the first polarity.

Effects of the Invention

As described above, the present disclosure makes it possible to suppress the increase in manufacturing costs while recording multivalued information in one memory cell.

Note that the above effects are not necessarily restrictive, and in addition to or instead of the above effects, any of the effects described in the present specification or other effects that can be determined from the present specification may be produced.

MODE FOR CARRYING OUT THE INVENTION

Figure 1:
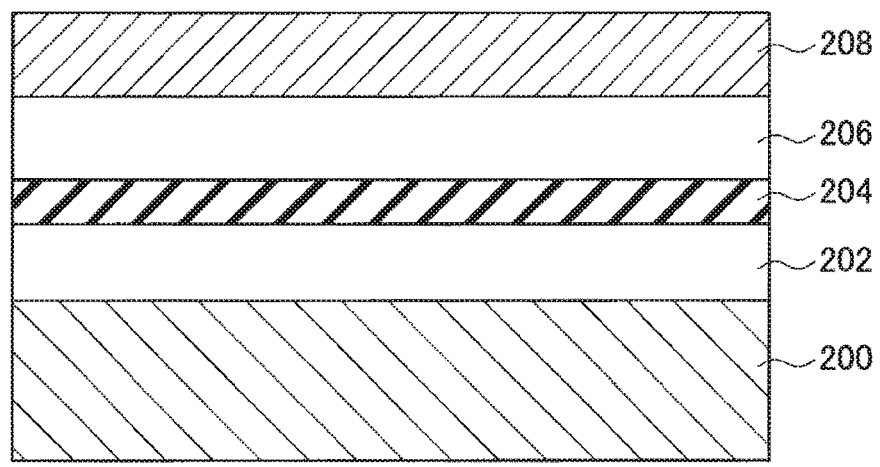
FIG. 1 is an explanatory diagram schematically showing one example of a laminated structure of an MTJ element 100 according to one embodiment of the present disclosure.

Preferred embodiments of the present disclosure will be described in detail below with reference to the accompanying drawings. Note that in the present specification and the drawings, components having substantially identical functional configurations are denoted with an identical reference symbol, and redundant description thereof will be omitted.

Furthermore, in the present specification and the drawings, a plurality of components having substantially identical or similar functional configurations is denoted with different numerals after the identical reference symbol for distinction in some cases. However, in a case where it is unnecessary to particularly distinguish each of the plurality of components having substantially identical or similar functional configurations, the components are denoted with only the identical reference symbol. Furthermore, similar components of different embodiments are denoted with different letters of the alphabet after the identical reference symbol for distinction in some cases. However, in a case where it is unnecessary to particularly distinguish each of the similar components, the components are denoted with only the identical reference symbol.

Then, the drawings referred to in the following description are drawings for describing one embodiment of the present disclosure and for promoting understanding thereof, and for ease of understanding, shapes, dimensions, ratios, and the like shown in the drawings may differ from actual ones. Moreover, the design of the magnetic memory and the like shown in the drawings can be appropriately changed in consideration of the following description and known techniques. Furthermore, in the following description, the vertical direction of the laminated structure of the magnetic memory or the like corresponds to a relative direction in a case where a surface on a substrate on which the memory device is provided is in an upward direction, and this may differ from the vertical direction according to the actual gravity acceleration.

Furthermore, in the following description, when a magnetization direction (magnetic moment) and magnetic anisotropy are described, terms such as "perpendicular direction" (direction perpendicular to a film surface) and "in-plane direction" (direction parallel with the film surface) are used for convenience. However, these terms do not necessarily mean strict magnetization directions. For example, wording such as "the magnetization direction is perpendicular" or "having perpendicular magnetic anisotropy" means that magnetization in the perpendicular direction is superior to magnetization in the in-plane direction. Similarly, for example, wording such as "the magnetization direction is in the in-plane direction" or "having in-plane magnetic anisotropy" means that magnetization in the in-plane direction is superior to magnetization in the perpendicular direction.

In the following description, "substantially identical" means not only a mathematically or geometrically identical case, but also a case where there is an allowable difference in the operation and manufacturing process of the magnetic memory according to one embodiment of the present disclosure.

Moreover, in the following description of a circuit configuration, "connection" means electrically connecting a plurality of elements unless otherwise noted. Moreover, "connection" in the following description includes not only a case of connecting a plurality of elements directly and electrically but also a case of connecting a plurality of elements indirectly and electrically via other elements.

Note that the description will be made in the following order.

1. Technical background according to the present disclosure
1.1. Overview of STT-MRAM
1.2. Basic structure of MTJ element
1.3. About recording and reading methods
1.4. About memory cell storing multivalued information
2. First embodiment
2.1. Configuration of memory cell 10 according to the first embodiment
2.2. Recording method according to the first embodiment
2.3. Reading method according to the first embodiment
3. Second embodiment
3.1. Configuration of magnetic memory 1 according to the second embodiment
3.2. Recording method according to the second embodiment
3.3. Specific exemplary configuration of magnetic memory 1 according to the second embodiment
4. Conclusion
5. Supplement

1. Technical Background According to the Present Disclosure

1.1. Overview of STT-MRAM

The embodiments of the present disclosure described below relate to an STT-MRAM. Therefore, before specifically describing one embodiment of the present disclosure, an overview of the STT-MRAM as a technical background according to the present disclosure will be described.

As described above, the STT-MRAM performs recording by reversing magnetization of a magnetic body using spin torque magnetization reversal. The STT-MRAM can operate at high speed, the number of rewrites is almost infinite, power consumption can be reduced, and capacity can be increased. Therefore, great expectations are placed.

As a memory element of the STT-MRAM (magnetic memory), an MTJ element is used. The MTJ element mainly includes a reference layer and a recording layer each including a magnetic body, and an insulating layer provided between the reference layer and the recording layer. Then, when spin-polarized electrons having passed through a magnetic body (reference layer) having the magnetic moment fixed in a predetermined direction enter another magnetic body (recording layer), the MTJ element performs recording by using the occurrence of reversal of the magnetic moment caused by the spin-polarized electrons giving torque to the magnetic moment of the other magnetic body. Moreover, in the MTJ element, the electric resistance in the insulating layer is lower and the electric resistance in the MTJ element is lower in a parallel state in which the directions of the magnetic moment of the reference layer and the recording layer are the same direction than in an anti-parallel state in which the directions of the magnetic moment of the reference layer and the recording layer are in opposite directions. Therefore, in the MTJ element, information of I/O is recorded by using the difference in the resistance state caused by the state of the magnetic moment (magnetization state).

1.2. Basic Structure of MTJ Element

Next, with reference to FIG. 1, the basic structure of the MTJ element 100 of the STT-MRAM (magnetic memory) will be described. Note that the MTJ element 100 according to the embodiments of the present disclosure described below also has a structure similar to the basic structure of the MTJ element 100 described with reference to FIG. 1. Furthermore, FIG. 1 is an explanatory diagram schematically showing one example of the laminated structure of the MTJ element 100 according to one embodiment of the present disclosure.

The MTJ element 100 is a memory element that stores information (I/O). Address wires orthogonal to each other (for example, word line and bit line) are provided above and below the MTJ element 100, and the MTJ element 100 is connected to the word line and the bit line near an intersection of these wires. Note that illustration of these wires is omitted in FIG. 1.

As shown in FIG. 1, the MTJ element 100 has a structure in which a reference layer 202 in which the magnetic moment (magnetization direction) is fixed in a predetermined direction, an insulating layer 204, a recording layer 206 capable of reversing the direction of magnetic moment, and a cap layer 208 are sequentially laminated on an underlayer 200. Furthermore, although not shown in FIG. 1, the MTJ element 100 is sandwiched between an upper electrode and a lower electrode. Moreover, one terminal of the MTJ element 100 is electrically connected to an address wire (not shown) via a selection transistor (not shown), and the other terminal of the MTJ element 100 is electrically connected to the other address wire (not shown). With this configuration, in the MTJ element 100 selected by the selection transistor, a voltage is applied between the lower electrode and the upper electrode of the MTJ element 100 via the address wires, and information is written to and read from the recording layer 206 of the MTJ element 100.

The reference layer 202 includes a magnetic body containing a ferromagnetic material, and the direction of the magnetic moment is fixed by high coercive force or the like. The recording layer 206 includes a magnetic body containing a ferromagnetic material, and the direction of the magnetic moment changes depending on information to record. For example, examples of the ferromagnetic material include amorphous perpendicular magnetization materials such as TbFeCo and GdFeCo, or magnetic materials having magnetocrystalline anisotropy such as CoPt and FePt. Moreover, examples of the ferromagnetic material also include an alloy magnetic material of at least one selected from Fe, Co, and Ni, and at least one selected from B and C.

The insulating layer 204 includes various insulators or the like, and is provided between the reference layer 202 and the recording layer 206. For example, the insulating layer 204 can be formed using various insulators, dielectrics, and semiconductors, for example, magnesium oxide, aluminum oxide, aluminum nitride, $SiO_2$, $Bi_2O_3$, $MgF_2$, CaF, $SrTiO_2$, $AlLaO_3$, Al—N—O, or the like.

Moreover, the underlayer 200 and the cap layer 208 function as an electrode, a control film of crystal orientation, a protective film, or the like. In more detail, the underlayer 200 includes various metal materials or alloy materials, and implement good conduction with an electrode (not shown) provided under the underlayer 200. Furthermore, the cap layer 208 includes, for example, a non-magnetic body such as Ru, prevents oxidation of the reference layer 202 and the recording layer 206 included in the MTJ element 100, and implements good conduction with an electrode (not shown) provided above the cap layer 208.

Note that as a laminated structure of the MTJ 100, FIG. 1 shows a structure in which the insulating layer 204 and the reference layer 202 are laminated downward with respect to the recording layer 206, but the MTJ element 100 is not limited to such a structure. For example, the MTJ element 100 may not include the underlayer 200 and the cap layer 208, and may further include other layers, or the positions of the reference layer 202 and the recording layer 206 may be switched. In other words, the MTJ element 100 is required at least to include the reference layer 202, the recording layer 206, and the insulating layer 204 held between the reference layer 202 and the recording layer 206.

1.3. Recording and Reading Methods (Recording Method)

Subsequently, recording and reading methods of information in the MTJ element 100 will be described. First, the recording method of information in the MTJ element 100 will be described. In the MTJ element 100, information is written into the recording layer 206 by using spin torque magnetization reversal as described above.

Here, details of spin torque magnetization reversal will be described. It is known that an electron has two kinds of spin angular momentum. Therefore, the spin angular momentum is provisionally defined as two kinds of spin angular momentum: upward spin angular momentum and downward spin angular momentum. Inside a non-magnetic body, the upward spin angular momentum and the downward spin angular momentum have the same number, and inside a ferromagnetic body, there is a difference in the number of these two kinds.

Moreover, here, the MTJ element 100 is in an antiparallel state in which the directions of the magnetic moment of the reference layer 202 and the recording layer 206 are different from each other, and in this state, consider a case where electrons enter the recording layer 206 from the reference layer 202.

In a case where the electrons pass through the reference layer 202, spin polarization occurs, in other words, a difference occurs in the number of upward spin angular momentum and downward spin angular momentum. Moreover, in a case where the insulating layer 204 is thin enough, before this spin polarization relaxes and becomes unpolarized (the number of upward and downward electrons is the same) in a normal non-magnetic body, the electrons can enter the recording layer 206.

In the recording layer 206, the direction of spin polarization is opposite to the direction of the electrons that have entered. Consequently, in order to lower the energy of the entire system, part of the electrons that have entered reverses, that is, the direction of spin angular momentum changes. At this time, since the spin angular momentum is preserved in the whole system, a reaction equivalent to the sum of the change in spin angular momentum caused by the reversed electrons is given to the magnetic moment of the recording layer 206.

In a case where a current, in other words, the number of electrons passing per unit time is small, the total number of electrons that change the direction is also small, and thus the spin angular momentum change that occurs in the magnetic moment of the recording layer 206 is also small. Meanwhile, if the current, in other words, the number of electrons passing per unit time is increased, a desired change in spin angular moment can be given to the magnetic moment of the recording layer 206 in a unit time. The change in spin angular moment over time is torque, and if the torque exceeds a predetermined threshold, the magnetic moment of the recording layer 206 starts to reverse and becomes stable in a 180-degree reversed state. Note that the magnetic moment of the recording layer 206 becomes stable in a 180-degree reversed state because the magnetic body constituting the recording layer 206 has an easy axis of magnetization and is uniaxially anisotropic. By the mechanism as described above, the MTJ element 100 changes from the antiparallel state to the parallel state in which the directions of the magnetic moment of the reference layer 202 and the recording layer 206 are the same.

Furthermore, in the parallel state, in a case where a current is reversely passed in a direction in which electrons enter the reference layer 202 from the recording layer 206, the electrons reflected and reversed by the reference layer 202 when reaching the reference layer 202 apply torque to the recording layer 206 when entering the recording layer 206. Consequently, the magnetic moment of the recording layer 206 is reversed by the given torque, and the MTJ element 100 changes from the parallel state to the antiparallel state.

As described above, information of I/O is recorded in the MTJ element 100 by passing a current equal to or greater than a predetermined threshold corresponding to each polarity in the direction from the reference layer 202 to the recording layer 206 or vice versa.

(Reading Method)

Next, the reading method of information in the MTJ element 100 will be described. In the MTJ element 100, information is read from the recording layer 206 by using a magnetoresistance effect. In more detail, in the MTJ element 100, the electric resistance in the insulating layer 204 is lower and the electric resistance of the MTJ element 100 as a whole is lower in the parallel state than in the antiparallel state. Therefore, by passing a current between the lower electrode (not shown) and the upper electrode (not shown) sandwiching the MTJ element 100 and determining the magnitude of electric resistance indicated by the MTJ element 100, the information stored in the recording layer 206 can be read.

1.4. About Memory Cell Storing Multivalued Information

Meanwhile, the present inventors have examined to record multivalued information in each memory cell as a method of further increasing the recording density of the MRAM (magnetic memory). In more detail, the lower limit of the MTJ element 100 of the MRAM or the like is determined on the basis of design rules that define the shape, size, or the like of wires such as a bit line or a word line and a contact part connecting the wires. Consequently, increasing the recording density of the MRAM by miniaturizing the MTJ element 100 is limited. Therefore, in order to increase the recording density, like the configuration disclosed in Patent Document 1 above, the present inventors have examined an MRAM in which two MTJ elements 100 connected in parallel to each other are provided in one memory cell to enable recording of multivalued information in one memory cell.

Specifically, the configuration of the memory cell first examined by the present inventors includes two MTJ elements 100 connected in parallel to each other and one selection transistor. One end of each of these two MTJ elements 100 is connected to one common selection transistor, and moreover, the other end of each of the two MTJ elements 100 is connected to one common address line (word line or bit line).

In such a memory cell, in order to selectively record information in either one of the MTJ elements 100 of the memory cell, or to distinguish and read the information recorded in each of the MTJ elements 100, it is required to make the magnetic characteristics of the two MTJ elements 100 different from each other. Therefore, in order to make the magnetic characteristics of the two MTJ elements 100 included in one memory cell different from each other, in Patent Document 1 above, two MTJ elements 100 are produced separately to form the MTJ elements having laminated structures different from each other. However, if the above memory cell is adopted, different laminated structures are produced separately, leading to an increase in the number of processes for manufacturing the magnetic memory, and as a result, it is difficult to suppress the increase in manufacturing costs.

Furthermore, in the memory cell described above, since the two MTJ elements 100 have magnetic characteristics different from each other, in order to selectively perform recording in the MTJ elements 100, different recording voltages (high voltage and low voltage) are simultaneously applied to both of the two MTJ elements 100 in two steps. However, the examination by the present inventors shows that such application of voltages in two steps to the two MTJ elements 100 leads to an increase in power consumption at the time of recording in the magnetic memory. Furthermore, in the memory cell described above, since the recording voltages are applied simultaneously to both of the MTJ elements 100, information is also recorded in the unintended MTJ element 100, and a recording error is likely to occur.

Moreover, the memory cell described above includes the two MTJ elements 100, and each MTJ element 100 has two types of resistance state. Therefore, when reading information from the memory cell, it is necessary to determine four types of resistance state. The difference in resistance values among the four types of resistance state is smaller than the difference in resistance values between two types of resistance state in a single-bit MRAM having one MTJ element 100 in one memory cell, leading to a decrease in a reading margin. Moreover, since the reading margin may be reduced by manufacturing variations, depending on the condition, it is difficult to determine the four types of resistance state, and a reading error is likely to occur. In other words, it can be said that the memory cell as described above is susceptible to manufacturing variations.

On the basis of such a situation, the present inventors have conducted intensive examinations on a magnetic memory, a recording method of the magnetic memory, and a reading method of the magnetic memory that can avoid the occurrence of recording errors and reading errors, and suppress the increase in power consumption and manufacturing costs, while recording multivalued information in one memory cell. Then, the present inventors have created one embodiment of the present disclosure to be described below on the basis of the present inventors' original examination. The following describes details of one embodiment of the present disclosure created by the present inventors.

2. First Embodiment

2.1. Configuration of Memory Cell 10 According to the First Embodiment

Figure 2:
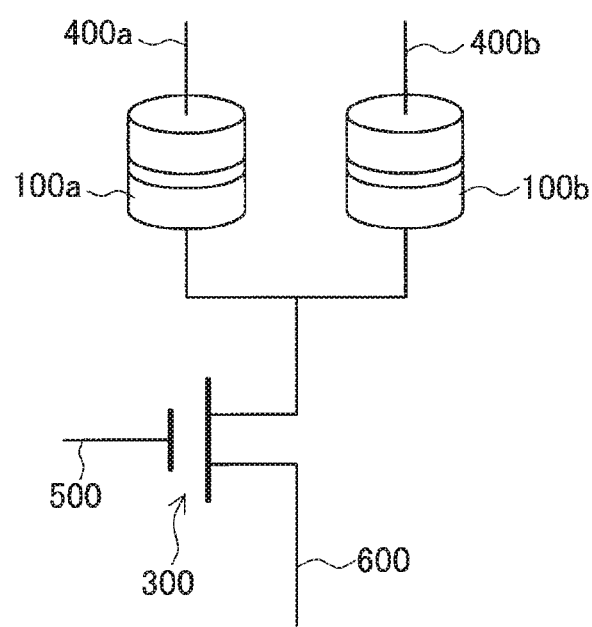
FIG. 2 is a circuit diagram schematically showing a memory cell 10 according to a first embodiment of the present disclosure.

First, with reference to FIG. 2, a configuration of the memory cell 10 according to the first embodiment of the present disclosure will be described. FIG. 2 is a circuit diagram schematically showing the memory cell 10 according to the present embodiment.

As shown in FIG. 2, the memory cell 10 according to the present embodiment includes two MTJ elements (first and second tunnel junction elements) 100a and 100b, and one selection transistor 300 electrically connected to one end of each of the two MTJ elements 100a and 100b. In other words, the selection transistor 300 is provided commonly to the two MTJ elements 100a and 100b. Moreover, other ends of the two MTJ elements 100a and 100b are connected to a word line (first wire) 400a and a word line (second wire) 400b different from each other, respectively. The MTJ elements 100a and 100b are MTJ elements having a laminated structure as shown in FIG. 1 described above. Furthermore, the selection transistor 300 is a metal-oxide-semiconductor (MOS) transistor, and in more detail, can be either an n-type MOS transistor or a p-type MOS transistor. Moreover, one end of each of the MTJ elements 100a and 100b is electrically connected to a drain (or source) of the selection transistor 300. Furthermore, a gate of the selection transistor 300 is connected to a control line 500, and the source (or drain), not connected to the MTJ elements 100a and 100b, of the selection transistor 300 is connected to a bit line (third wire) 600.

Note that the MTJ elements 100a and 100b have magnetic characteristics (reversal current, element resistance value, or the like) substantially identical to each other. In more detail, the element resistance values in a high resistance state are substantially identical and the element resistance values in a low resistance state are substantially identical between the MTJ elements 100a and 100b. Furthermore, threshold values of the reversal current at which the magnetic moment of the recording layer 206 reverses are substantially identical to each other between the MTJ elements 100a and 100b.

Consequently, the MTJ elements 100a and 100b have, for example, shapes substantially identical to each other, and each layer of the MTJ elements 100a and 100b can have a material common to the MTJ elements 100a and 100b and film thicknesses substantially identical to each other. With this configuration, in the present embodiment, since it is unnecessary to produce the MTJ elements 100a and 100b separately, an increase in the number of processes in the manufacturing can be avoided, and as a result, an increase in manufacturing costs can be avoided.

Note that the two MTJ elements 100a and 100b are provided in one memory cell 10 in FIG. 2, but the present embodiment is not limited to this case. For example, one memory cell 10 may include three or more MTJ elements 100 connected in parallel to one another. In this case, it is at least required that the three or more MTJ elements 100 are connected to one common selection transistor 300 and connected to word lines 400 different from one another.

Furthermore, the above description has been made assuming that the MTJ elements 100a and 100b have the magnetic characteristics substantially identical to each other. However, the present embodiment is not limited to this case, and the MTJ elements 100a and 100b may have magnetic characteristics different from each other. In this case, it becomes difficult to avoid the increase in manufacturing costs, but it becomes possible to apply the recording method and the reading method described below.

2.2. Recording Method According to the First Embodiment

Figure 3:
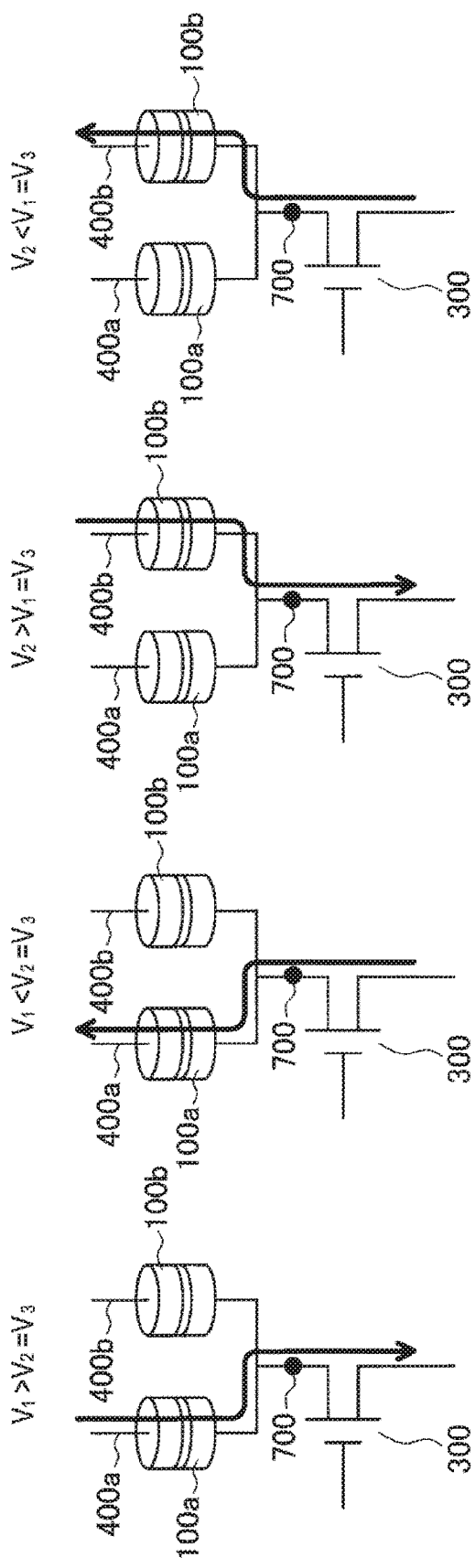
FIG. 3 is an explanatory diagram describing a recording method of the memory cell 10 according to the first embodiment of the present disclosure.

Next, the recording method in the memory cell 10 according to the first embodiment will be described with reference to FIG. 3. FIG. 3 is an explanatory diagram describing the recording method of the memory cell 10 according to the present embodiment, and in more detail, FIG. 3 shows four recording patterns in the memory cell 10. Note that in the following description, the potential in the word line 400a is denoted as $V_1$, the potential in the word line 400b is denoted as $V_2$, and the potential at a node 700 where the selection transistor 300 and the MTJ elements 100a and 100b are electrically connected is denoted as $V_3$.

First, the recording pattern of $V_1>V_2=V_3$ shown on the leftmost side of FIG. 3 will be described. In this case, if the selection transistor 300 is set in a conductive state, the potential difference between the potential $V_1$ of the word line 400a and the potential $V_3$ at the node 700 causes a current to flow downward from above through the MTJ element 100a, and information according to the direction of the current flow is recorded in the MTJ element 100a. Meanwhile, since there is no potential difference between the potential $V_2$ of the word line 400b and the potential $V_3$ at the node 700, no current flows through the MTJ element 100b and no information is recorded in the MTJ element 100b.

Furthermore, the recording pattern of $V_1<V_2=V_3$ shown second from the left of FIG. 3 will be described. In this case, the potential difference between the potential $V_1$ of the word line 400a and the potential $V_3$ at the node 700 causes a current to flow in a direction opposite to the above direction, in other words, upward from below through the MTJ element 100a. As a result, information having a polarity opposite to the polarity described above is recorded in the MTJ element 100a according to the direction of the current flow. In this case as well, since there is no potential difference between the potential $V_2$ of the word line 400b and the potential $V_3$ at the node 700, no current flows through the MTJ element 100b and no information is recorded in the MTJ element 100b.

Moreover, as shown on the rightmost side and the second from the right in FIG. 3, the potential is set to be opposite to the above patterns, in other words, the potential is set such that $V_2>V_1=V_3$ or $V_2<V_1=V_3$. As a result, information having a polarity according to the direction of the current flow is recorded in the MTJ element 100b.

As described above, in the present embodiment, by setting the selection transistor 300 in a conductive state and giving the potential difference between the word line 400a and the word line 400b, information is selectively recorded into either of the MTJ elements 100a and 100b of the memory cell 10.

In other words, in the present embodiment, the two MTJ elements 100a and 100b of the memory cell 10 are connected to the word lines 400a and 400b different from each other, respectively. Consequently, it is easy to selectively apply the recording voltage to either one of the MTJ elements 100a and 100b by controlling the potential applied to the word lines 400a and 400b. As a result, the present embodiment makes it possible to avoid simultaneous application of the recording voltage to both of the MTJ elements 100a and 100b included in the memory cell 10, and to avoid the occurrence of recording errors of information being recorded in the unintended MTJ element 100 as well. In other words, even if the two MTJ elements 100a and 100b of the memory cell 10 have magnetic characteristics substantially identical to each other, information can be selectively recorded in one of the MTJ elements 100.

Furthermore, in the present embodiment, since the two MTJ elements 100 have magnetic characteristics substantially identical to each other, in order to selectively record information in one of the MTJ elements 100, it is required at least to selectively apply the substantially identical recording voltage to one of the MTJ elements 100. As a result, it is possible to avoid applying the recording voltage simultaneously to the two MTJ elements 100 in two steps, and the present embodiment makes it possible to avoid an increase in power consumption when recording information in the magnetic memory.

Note that the potential $V_3$ at the node 700 preferably has the potential substantially identical to the potential $V_1$ of the word line 400a or the potential $V_2$ of the word line 400b. Consequently, in consideration of on resistance of the selection transistor 300, it is preferable to set the potential of the bit line 600 connected to the source of the selection transistor 300 as follows. In a case where a current is to be passed from the MTJ element 100 side to the selection transistor 300, the potential of the bit line 600 is preferably set at potential lower than the potential $V_3$ at the node 700. Furthermore, similarly, in a case where a current is to be passed from the selection transistor 300 to the MTJ element 100 side, the potential of the bit line 600 is preferably set at potential higher than the potential $V_3$ at the node 700.

Note that the above description has been made assuming that the MTJ elements 100a and 100b have magnetic characteristics substantially identical to each other. However, the present embodiment is not limited to this case, and the MTJ elements 100a and 100b may have magnetic characteristics different from each other. For example, although the two MTJ elements 100a and 100b have slightly different magnetic characteristics, a desired degree of difference in the magnetic characteristics is not be secured in some cases due to manufacturing variations. Even in such a case, the recording method of the present embodiment makes it possible to selectively record information into one of the MTJ elements 100a and 100b of the memory cell 10.

2.3. Reading Method According to the First Embodiment

Figure 4:
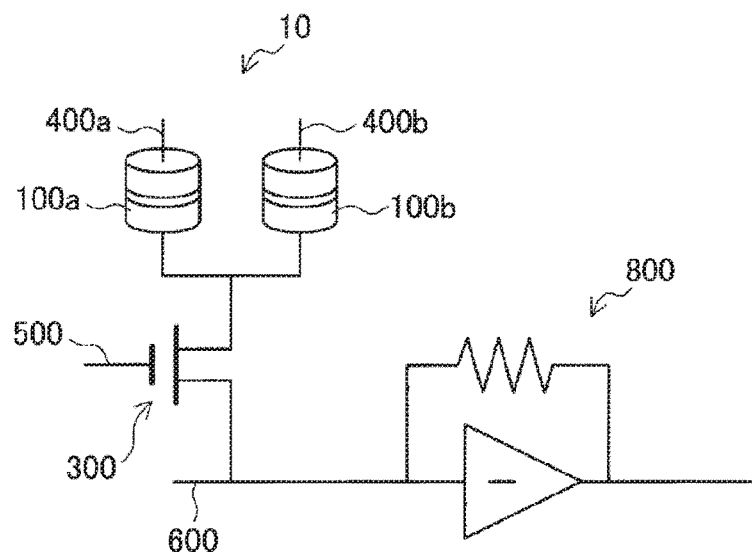
FIG. 4 is a circuit diagram schematically showing one example of a peripheral circuit of the memory cell 10 according to the first embodiment of the present disclosure.
Figure 5:
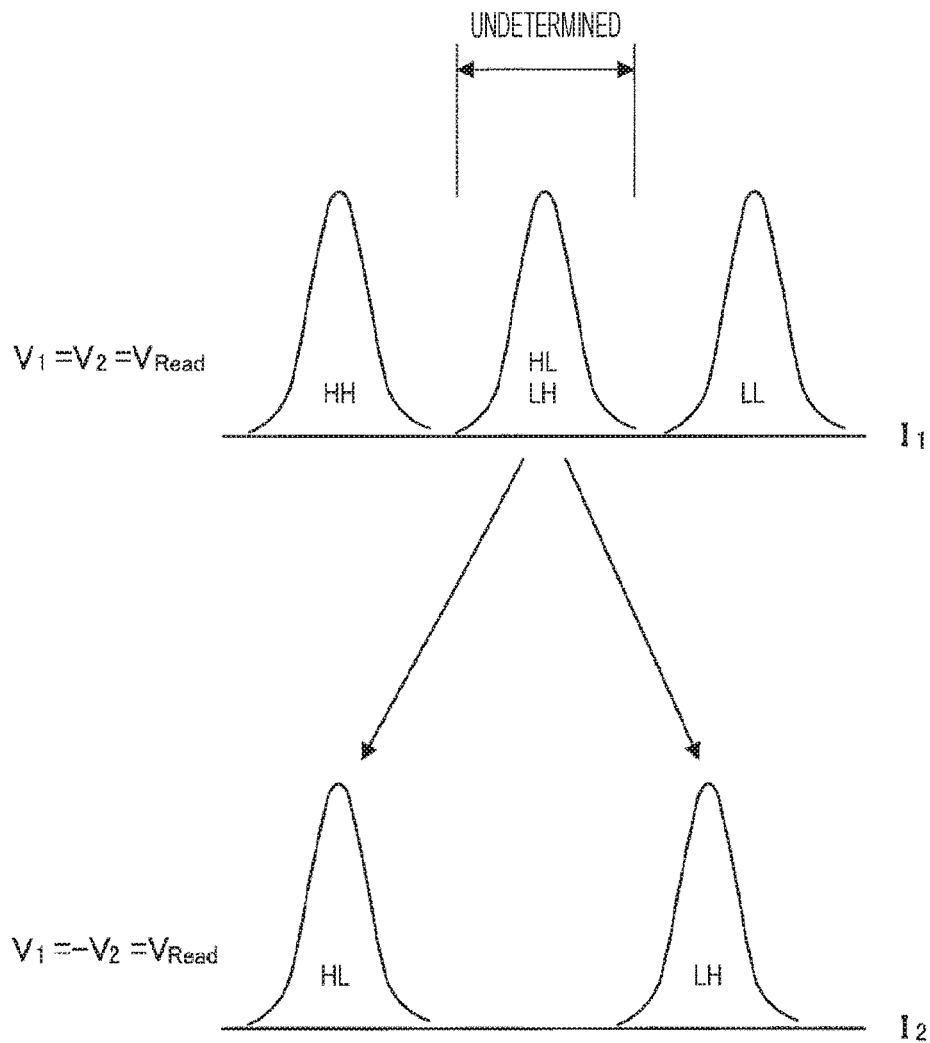
FIG. 5 is an explanatory diagram describing a reading method of the memory cell 10 according to the first embodiment of the present disclosure.

Next, the reading method in the memory cell 10 according to the first embodiment will be described with reference to FIGS. 4 and 5. FIG. 4 is a circuit diagram schematically showing one example of a peripheral circuit of the memory cell 10 according to the present embodiment, and FIG. 5 is an explanatory diagram describing the reading method of the memory cell 10 according to the present embodiment. Note that in the following description, the element resistance value of the MTJ element 100a is Ra, and the element resistance value of the MTJ element 100b is Rb.

Meanwhile, the memory cell 10 according to the present embodiment includes two MTJ elements 100a and 100b, and each of the MTJ elements 100a and 100b has two types of resistance state. Therefore, when reading information from the memory cell, it is necessary to determine four types of resistance state. In more detail, the resistance state in the memory cell 10 has the following four types of resistance state. The four types includes: a case where both of the MTJ elements 100a and 100b are in a high resistance state (hereinafter referred to as an HH state); a case where both of the MTJ elements 100a and 100b are in a low resistance state (hereinafter referred to as an LL state), a case where the MTJ element 100a is in a high resistance state and the MTJ element 100b is in a low resistance state (hereinafter referred to as an HL state), and a case opposite to the HL state (hereinafter referred to as an LH state).

The difference in resistance values among the four resistance states is smaller than the difference in resistance values between two types of resistance state in a single-bit magnetic memory having one MTJ element in one memory cell, leading to a decrease in a reading margin. Consequently, in a case where the reading margin is further reduced by manufacturing variations, it is difficult to determine the four types of resistance state, and a reading error is likely to occur.

Therefore, the reading method according to the present embodiment applies voltages in two steps to read information from the MTJ elements 100a and 100b, by using the fact that the two MTJ elements 100a and 100b are connected to the word lines 400a and 400b different from each other, respectively. In this way, in the present embodiment, even if the reading margin is reduced by manufacturing variations or the like, four types of resistance state can be determined, and the occurrence of the reading error can be avoided.

The following describes, as one example of the reading method according to the present embodiment, the reading method using a current-voltage conversion amplifier 800 connected to the bit line 600 as shown in FIG. 4.

First, in a case where information is read in a circuit as shown in FIG. 4, the selection transistor 300 of the memory cell 10 in which information to read is recorded is brought into a conductive state. Moreover, the potential of the bit line 600 is set at 0 V.

Then, as a first step, both of the potential $V_1$ of the word line 400a and the potential $V_2$ of the word line 400b are set at predetermined reading potential $V_{Read}$. In a case where the above setting is made, a current $I_1$ flowing through the bit line 600 can be expressed by Equation 1 below.

[Equation 1]

$$I_1 = V_{Read}(1/R_a + 1/R_b) \qquad \text{(Equation 1)}$$

Next, as a second step, the potential $V_1$ of the word line 400a is set at the predetermined reading potential $V_{Read}$, and the potential $V_2$ of the word line 400b is set to have the same absolute value as the predetermined reading potential $V_{Read}$ and to have a polarity opposite to the polarity of the predetermined reading potential $V_{Read}$, in other words, the potential $V_2$ is set at $-V_{Read}$. In a case where the above setting is made, a current $I_2$ flowing through the bit line 600 can be expressed by Equation 2 below.

[Equation 2]

$$I_2 = V_{Read}(1/R_a - 1/R_b) \qquad \text{(Equation 2)}$$

Moreover, from Equations 1 and 2, element resistances Ra and Rb of the MTJ elements 100a and 100b can be expressed by Equation 3 below.

[Equation 3]

$$R_a = 2V_{Read}/(I_1 + I_2)$$

$$R_b = 2V_{Read}/(I_1 - I_2) \qquad \text{(Equation 3)}$$

Consequently, by performing arithmetic processing using two current values $I_1$ and $I_2$ detected by the current-voltage conversion amplifier 800 in two steps, the element resistances Ra and Rb of the MTJ elements 100a and 100b can be calculated. Moreover, the information recorded in the MTJ elements 100a and 100b can be determined from the calculated element resistances Ra and Rb of the MTJ elements 100a and 10b.

In other words, in the present embodiment, the selection transistor 300 is brought into a conductive state, voltages are applied to the word lines 400a and 400b to have a first polarity with respect to the bit line 600, then, a voltage is applied to one of the word lines 400a and 400b so as to have a second polarity opposite to the first polarity with respect to the bit line 600. In this way, the reading method according to the present embodiment applies a voltage in two steps to be able to read information from the MTJ elements 100a and 100b, by using the fact that the two MTJ elements 100a and 100b are connected to the word lines 400a and 400b different from each other, respectively.

As described above, arithmetic processing may be performed to determine the element resistances Ra and Rb of respective MTJ elements 100a and 100b, but in reading the information of the MTJ elements 100a and 100b, it is at least required that the resistance state of each of the MTJ elements 100a and 100b can be determined. Therefore, as shown in FIG. 5, the following describes a method of reading information of the MTJ elements 100a and 100b by determining four types of resistance state of one memory cell.

First, the reading method according to the present embodiment performs three-value determination as shown in the upper part of FIG. 5 as the first step. In more detail, as the first step, the selection transistor 300 is brought into a conductive state, the potential of the bit line 600 is set at 0 V, and both of the potential $V_1$ of the word line 400a and the potential $V_2$ of the word line 400b are set at the predetermined reading potential $V_{Read}$. In a case where the above setting is made, by detecting the current $I_1$ flowing through the bit line 600, it is possible to determine whether or not the resistance state of the memory cell 10 is in any of the three types: "HH state", "LL state", and "HL state and LH state" (three-value determination). Note that in the present embodiment, since the MTJ elements 100a and 100b have substantially identical magnetic characteristics, in a case where the resistance state of the memory cell 10 is the HL state or the LH state, it is not possible to determine in the step which of the HL state and the LH state the resistance state of the memory cell 10 is.

Therefore, in a case where it is determined in the first step that the resistance state of the memory cell 10 is the HL state or LH state, in other words, in a case where the resistance state is undetermined, the second step is performed. In more detail, as the second step, the potential $V_1$ of the word line 400a is set at the predetermined reading potential $V_{Read}$, and the potential $V_2$ of the word line 400b is set at $-V_{Read}$. As described above, since different voltages are applied to the MTJ elements 100a and 100b in this step, it is possible to determine the HL state and the LH state as shown in the lower part of FIG. 5 (two-value determination).

As described above, since the second step may be performed as needed, the time needed to read information can be shortened. Note that the above reading method can avoid reading errors more by repeating the two steps twice or more. Furthermore, in the present embodiment, the peripheral circuit and the like are not limited to the circuit shown in FIG. 4, and other peripheral circuits may be used.

As described above, the reading method according to the present embodiment applies voltages in two steps to read information from the MTJ elements 100a and 100b, by using the fact that the two MTJ elements 100a and 100b are connected to the word lines 400a and 400b different from each other, respectively. Consequently, even if the two MTJ elements 100a and 100b of the memory cell 10 have magnetic characteristics substantially identical to each other, information can be read from each of the MTJ elements 100.

Note that the above description has been made assuming that the MTJ elements 100a and 100b have magnetic characteristics substantially identical to each other. However, the present embodiment is not limited to this case, and the MTJ elements 100a and 100b may have magnetic characteristics different from each other. For example, although the two MTJ elements 100a and 100b have slightly different magnetic characteristics, a desired degree of difference in the magnetic characteristics is not be secured in some cases due to manufacturing variations. Even in such a case, the reading method of the present embodiment makes it possible to read information from each of the MTJ elements 100a and 100b of the memory cell 10.

As described above, the present embodiment can provide the magnetic memory 1, the recording method of the magnetic memory 1, and the reading method of the magnetic memory 1 that can avoid the occurrence of recording errors and reading errors, and suppress the increase in power consumption and manufacturing costs, while recording multivalued information in one memory cell 10.

3. Second Embodiment

An actual magnetic memory 1 includes a plurality of the memory cells 10 according to the first embodiment described above. Therefore, a configuration of the magnetic memory 1 and a recording method of such a magnetic memory 1 will be described below.

3.1. Configuration of Magnetic Memory 1 According to the Second Embodiment

Figure 6:
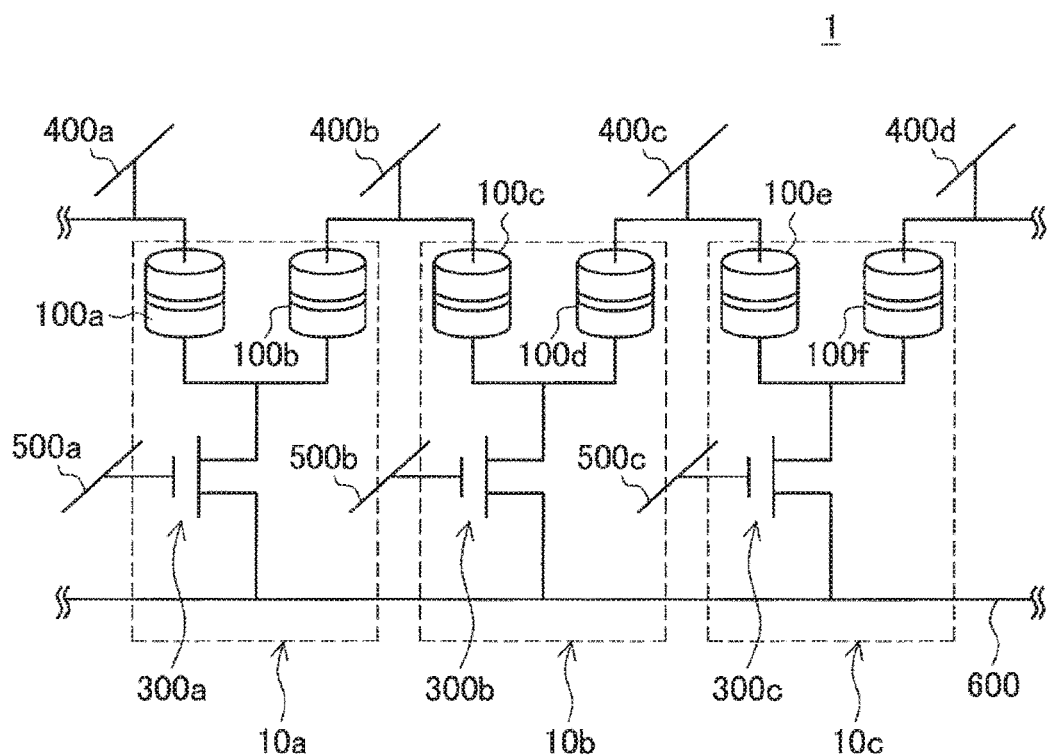
FIG. 6 is a circuit diagram schematically showing a magnetic memory 1 according to a second embodiment of the present disclosure.

First, the configuration of the magnetic memory 1 according to the present embodiment will be described with reference to FIG. 6. FIG. 6 is a circuit diagram schematically showing the magnetic memory 1 according to the present embodiment.

As shown in FIG. 6, the magnetic memory 1 includes a plurality of memory cells 10a to 10c, and first ends of MTJ elements 100 included in the identical memory cell 10 are connected to word lines 400 different from each other as in the first embodiment. Moreover, the word line 400 connected to one of the MTJ elements 100 included in the memory cell 10 is connected to one of the MTJ elements 100 included in another memory cell 10 adjacent to the memory cell 10. In other words, between two memory cells 10 adjacent to each other, one MTJ elements 100 included in respective memory cells 10 share one word line 400 with each other.

Specifically, the magnetic memory 1 includes the memory cell 10a including the MTJ elements 100a and 100b and a selection transistor 300a, and the MTJ elements 100a and 100b are connected to word lines 400a and 400b different from each other, respectively. Moreover, the magnetic memory 1 includes the memory cell 10b adjacent to the memory cell 10a, and the memory cell 10b includes MTJ elements 100c and 100d and a selection transistor (second selection transistor) 300b. Furthermore, the MTJ element (third tunnel junction element) 100c is connected to the word line 400b.

Note that in the present embodiment, between two memory cells 10 adjacent to each other, one MTJ elements 100 included in respective memory cells 10 share one word line 400 with each other, thereby reducing the number of word lines 400 and reducing manufacturing costs. However, the present embodiment is not limited to the configuration in which the word line 400 is shared, and the MTJ elements 100 are required at least to be connected to different word line 400 in the identical memory cell 10.

3.2. Recording Method According to the Second Embodiment

Next, the recording method of the magnetic memory 1 according to the present embodiment will be described with reference to FIG. 6. In the present embodiment as well, as in the first embodiment, by controlling the potential difference between the word lines 400, it is possible to select which of two MTJ elements 100 included in one memory cell 10 to perform recording.

Here, a case where information is recorded in the MTJ element 100c and the MTJ element 100d of FIG. 6 will be described.

First, the word line 400b is set at high potential and the word line 400c is set at low potential. In a case where the selection transistor 300b is in a nonconductive state, currents having an identical value flow through both of the MTJ element 100c and the MTJ element 100d.

Therefore, in a case where a voltage is applied to the control line 500b to bring the selection transistor 300b into a conductive state, the potential difference between the word lines 400b and 400c and the bit line 600 causes a difference in the current flowing through the MTJ element 100c and the MTJ element 100*d*. In more detail, if the potential of the bit line 600 is low potential, the current flowing through the MTJ element 100*c* increases, and the current flowing through the MTJ element 100*d* decreases. On the other hand, if the potential of the bit line 600 is high potential, the current flowing through the MTJ element 100*c* decreases, and the current flowing through the MTJ element 100*d* increases. Consequently, by setting each potential such that recording can be performed in the MTJ element 100 by the increased current and that recording cannot be performed in the MTJ element 100 by the decreased current, information can be selectively recorded in either of the MTJ element 100*c* or the MTJ element 100*d*. Furthermore, in a case where the word line 400*b* is set at low potential and the word line 400*c* is set at high potential as well, information can be selectively recorded in either of the MTJ element 100*c* or the MTJ element 100*d* by performing setting opposite to the setting described above. In other words, in the present embodiment, information can be selectively recorded in one of the MTJ elements 100 by providing a difference between the current values flowing through the two MTJ elements 100 of one memory cell 10.

Note that the word lines 400 other than those shown above are not connected (floating) such that no current flows, and similarly, the control lines 500 other than those shown above are also set at a voltage at which each selection transistor 300 is in a nonconductive state.

In other words, in the present embodiment, by bringing the selection transistor 300 of the memory cell 10 into a conductive state and providing a potential difference or difference in a current value between two word lines 400 connected to respective MTJ elements 100 of the memory cell 10, recording can be performed in one of the MTJ elements 100.

Note that in the above recording method, it is also possible to simultaneously record desired information in the plurality of MTJ elements 100 by controlling the potential of respective word lines 400 and bit lines 600 and the conductive state of the selection transistor 300. Such control can shorten the time needed to perform recording in the magnetic memory 1.

In the present embodiment, recording can be performed in one of the MTJ elements 100 by providing the potential difference between two word lines 400 connected to respective MTJ elements 100 of the memory cell 10. By applying such a method, information can be sequentially recorded in respective MTJ elements 100 of the magnetic memory 1 by performing two steps.

Figure 7:
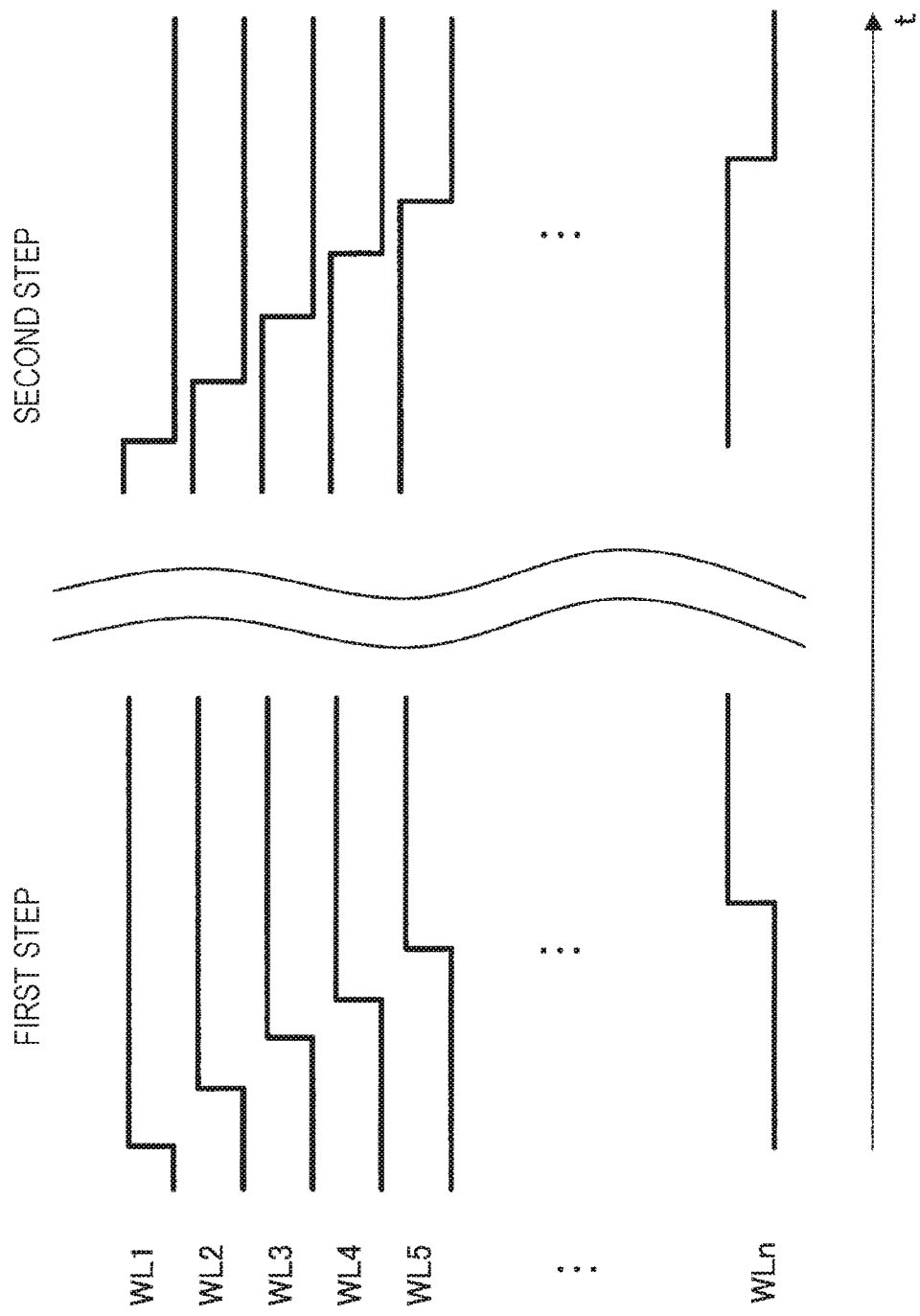
FIG. 7 is an explanatory diagram for describing one example of a recording method of the magnetic memory 1 according to the second embodiment of the present disclosure.

For example, with reference to FIG. 7, a method of sequentially recording information in respective MTJ elements 100 of the magnetic memory 1 will be described. FIG. 7 is an explanatory diagram for describing one example of the recording method of the magnetic memory 1 according to the present embodiment. In more detail, the left side of FIG. 7 shows a pattern of voltages applied to respective word lines 400 in the first step, and the right side of FIG. 7 shows a pattern of voltages applied to respective word lines 400 in the second step. In each voltage pattern shown in FIG. 7, the horizontal axis indicates the passage of time, and the vertical direction indicates the voltages applied to respective word lines 400.

As shown on the left side of FIG. 7, as the first step, the voltage applied to each word line 400 is sequentially switched from a low voltage (first voltage) to a high voltage (second voltage). Since information is recorded in one MTJ element 100 of the memory cell 10 corresponding to the point where the voltage is switched, information is sequentially recorded in one MTJ element 100 of each memory cell 10.

Moreover, as shown on the right side of FIG. 7, as the second step, the voltage applied to each word line 400 is sequentially switched from the high voltage (second voltage) to the low voltage (second voltage). Because of the polarity of the potential difference provided in this way, this time, information is recorded in the other MTJ element 100 of the memory cell 10 corresponding to the point where the voltage is switched. Consequently, by sequentially switching the voltage as described above, information is sequentially recorded in the other MTJ element 100 of each memory cell 10.

In other words, in the recording method described above, information can be sequentially recorded in each of the MTJ elements 100 of the magnetic memory 1. Note that in the recording method described above, the voltages to set may be reversed, and order of switching the voltages may be reversed.

Figure 8:
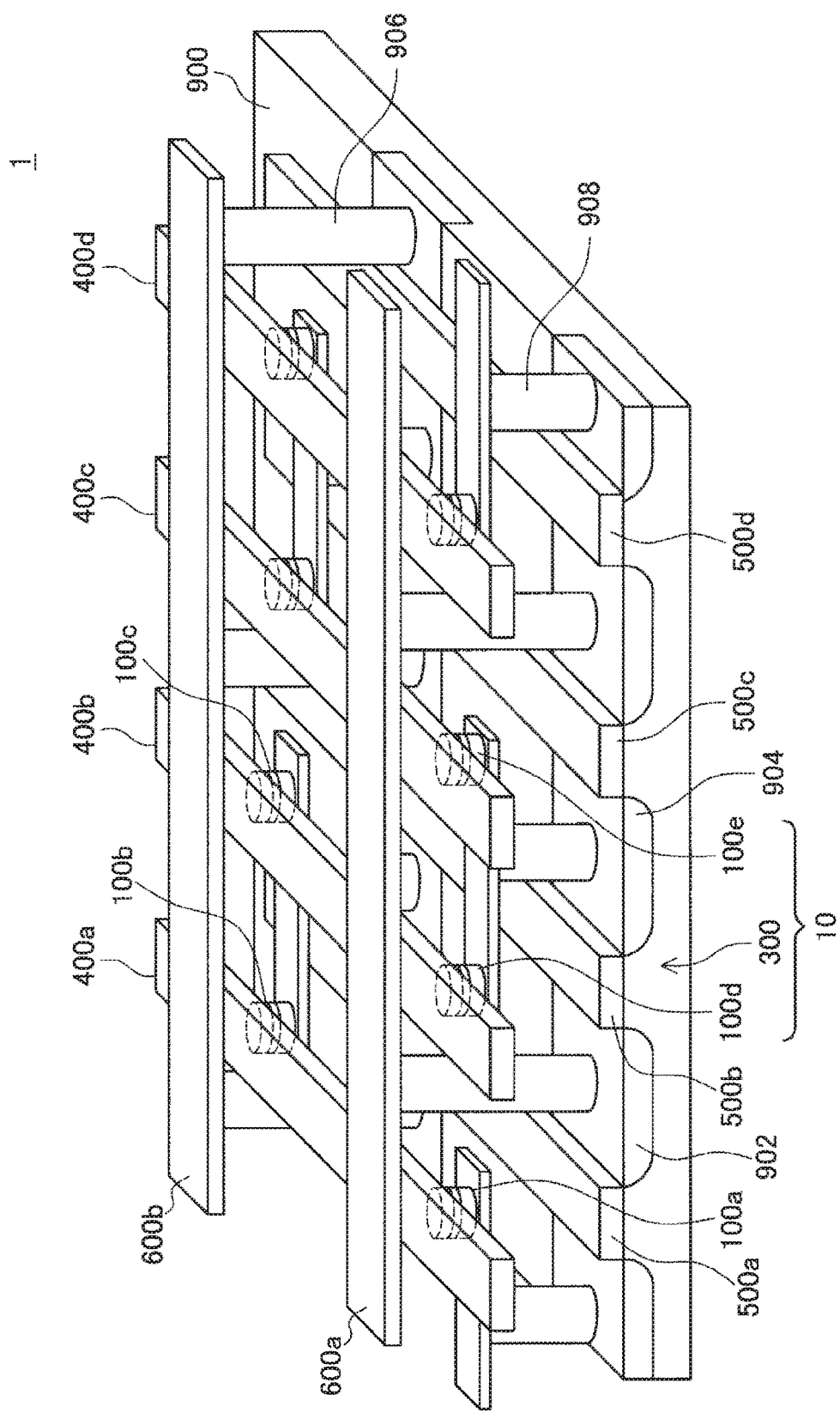
FIG. 8 is a perspective view of one example of a specific configuration of the magnetic memory 1 according to the second embodiment of the present disclosure.
Figure 9:
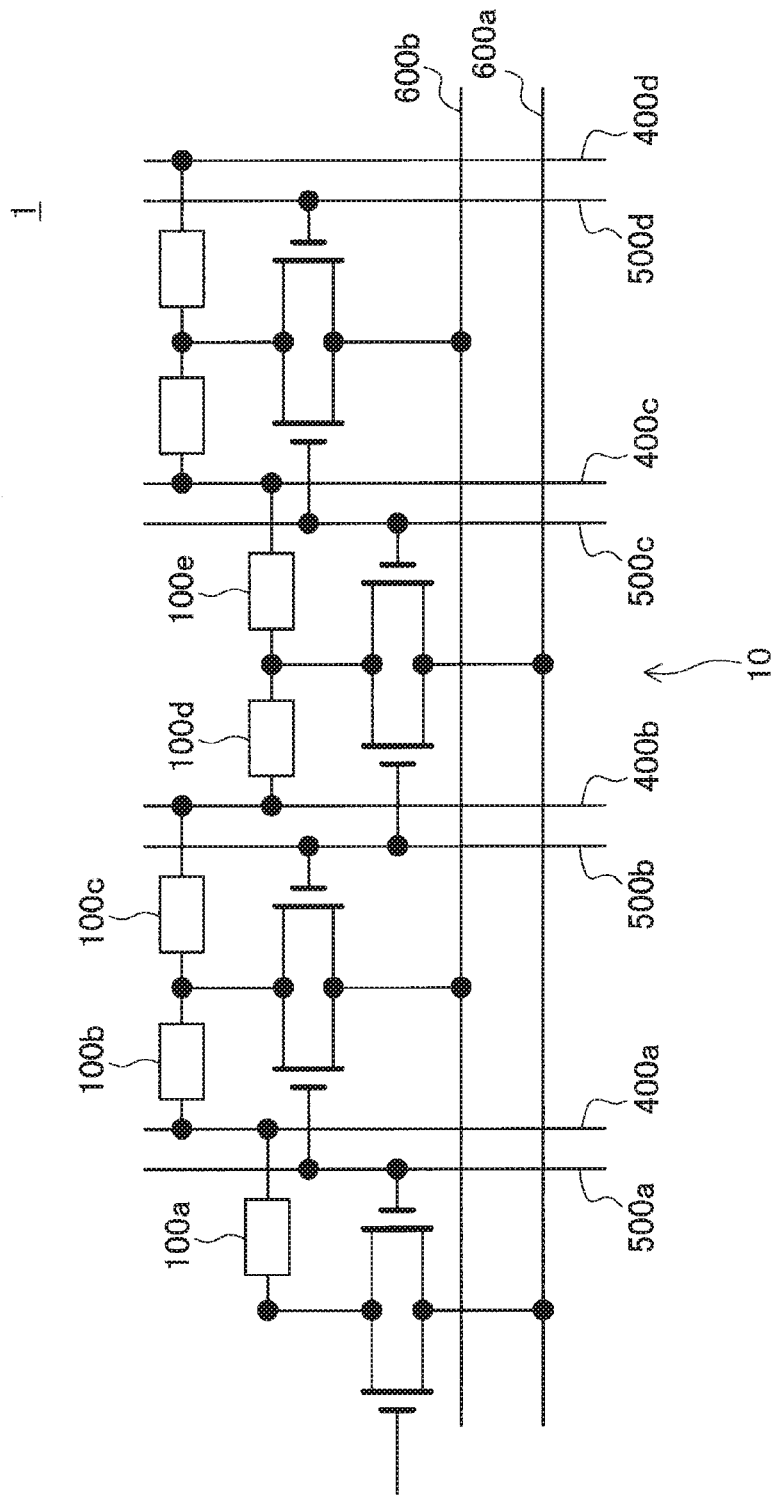
FIG. 9 is a circuit diagram of the magnetic memory 1 of FIG. 8.

3.3. Specific Exemplary Configuration of the Magnetic Memory 1 According to the Second Embodiment Next, the specific configuration of the magnetic memory 1 according to the present embodiment will be described with reference to FIGS. 8 and 9. FIG. 8 is a perspective view of one example of the specific configuration of the magnetic memory 1 according to the present embodiment, and FIG. 9 is a circuit diagram of the magnetic memory 1 of FIG. 8. Note that in FIGS. 8 and 9, a part of the magnetic memory 1 is extracted and shown.

As shown in FIG. 8, the magnetic memory 1 according to the present embodiment includes a plurality of memory cells 10 arranged in a matrix on a substrate 900. Each memory cell 10 includes two MTJ elements 100 and a selection transistor 300.

In more detail, control lines 500*a* to 500*d* are provided on the substrate 900 so as to extend along a first direction. The control lines 500*a* to 500*d* function as gate electrodes of respective selection transistors 300. A source 902 and a drain 904 of each selection transistor 300 are provided on a surface layer of the substrate 900 so as to sandwich the control lines 500*a* to 500*d*. Note that in FIG. 9, in the two memory cells 10 adjacent to each other, the selection transistors 300 are provided so as to share the source 902 or the drain 904 with each other. In other words, in the example shown in FIG. 9, a separation layer for separating the selection transistor 300 from the adjacent selection transistor 300 is not provided. The recording density in the magnetic memory 1 is improved by adopting such a configuration in which the separation layer is not provided. Note that in this case, at the time of operation of the magnetic memory 1, by controlling the voltage of the gate voltage of the adjacent selection transistor 300 (in other words, control line 500), separation from the adjacent selection transistor 300 can be performed.

Furthermore, a contact via 906 is provided on the source 902, and the source 902 is coupled to the bit lines 600*a* and 600*b* extending along a second direction orthogonal to the first direction by the contact via 906. Moreover, a contact via 908 is also provided on the drain 904, and the drain 904 is coupled to two of the plurality of MTJ elements 100 arranged in a matrix by the contact via 906. Moreover, the word lines 400 different from each other are provided above the two MTJ elements 100 coupled to the identical contact via 906. The word lines 400a to 400d are provided to extend along the first direction.

Note that FIG. 9 is a circuit diagram in which a part of the exemplary configuration of FIG. 8 is extracted.

In the magnetic memory 1 shown in FIGS. 8 and 9, in a case where information of "1" is recorded in the MTJ 100b, it is at least required that a high voltage is applied to the control line 500a and the word line 400a, a low voltage is applied to the bit line 600b, and the other lines are left floated. On the other hand, in a case where information of "0" is recorded in the MTJ 100b, it is at least required that a high voltage is applied to the control line 500a and the bit line 600b, and a low voltage is applied to the word line 400a.

Note that as described above, in the present embodiment, the selection transistor 300 may be an n-type MOS transistor or a p-type MOS transistor, and the voltage to apply to the corresponding control line 500 is changed depending on the polarity of the selection transistor 300.

Figure 10:
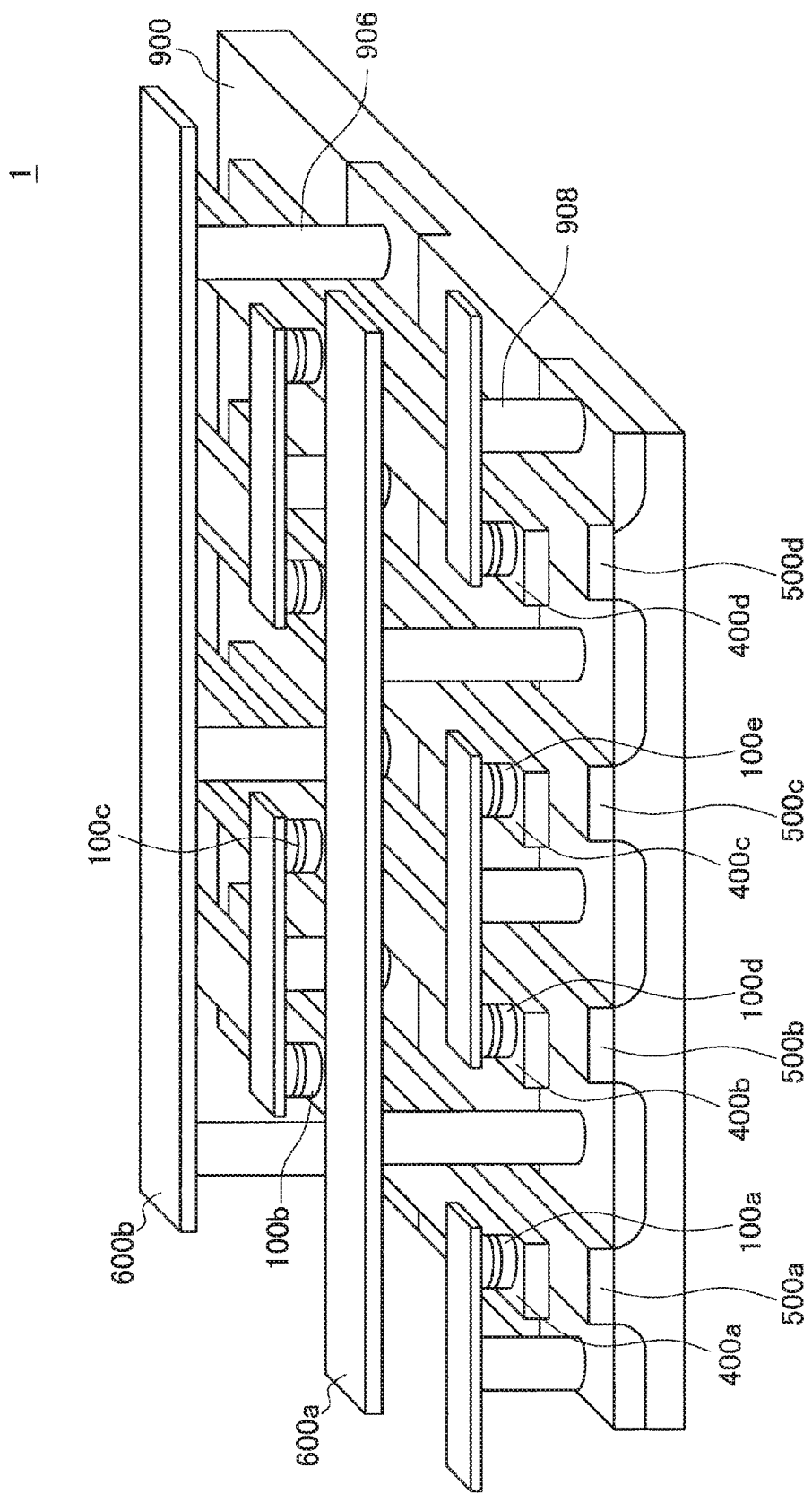
FIG. 10 is a perspective view of another example of the specific configuration of the magnetic memory 1 according to the second embodiment of the present disclosure.

Note that in the present embodiment, the exemplary configuration of the magnetic memory 1 is not limited to the example shown in FIG. 8 and may be another exemplary configuration. For example, another example will be described with reference to FIG. 10. FIG. 10 is a perspective view of another example of the specific configuration of the magnetic memory 1 according to the present embodiment. The word line 400 is provided above the MTJ element 100 in the example shown in FIG. 8, but the word line 400 may be provided below the MTJ element 100 as shown in FIG. 10.

Furthermore, the magnetic memory 1 according to the present embodiment can be manufactured by using apparatuses and conditions used for manufacturing general semiconductor devices. For example, the magnetic memory 1 according to the present embodiment can be manufactured by suitably using a sputtering method, a chemical vapor deposion (CVD) method, a photolithography method, an etching method, a chemical mechanical polish (CMP) method, or the like.

4. Conclusion

As described above, the embodiments of the present disclosure can provide the magnetic memory 1, the recording method of the magnetic memory 1, and the reading method of the magnetic memory 1 that can avoid the occurrence of recording errors and reading errors, and suppress the increase in power consumption and manufacturing costs, while recording multivalued information in one memory cell 10.

Note that the MTJ element 100 according to the embodiments of the present disclosure is not limited to the MTJ element having a perpendicular magnetization film, but may be an MTJ element having an in-plane magnetization film.

Furthermore, the magnetic memory 1 according to the present embodiment may be mounted on an identical semiconductor chip together with a semiconductor circuit constituting an arithmetic device or the like to constitute a semiconductor device (system-on-a-chip: SoC). Furthermore, the magnetic memory 1 according to the present embodiment may be mounted on various electric devices on which a storage device can be mounted. For example, the magnetic memory 1 may be mounted, as a memory for temporary storage or as a storage, on various electronic devices such as various mobile devices (smartphones, tablet PCs (personal computers), and the like), notebook PCs, wearable devices, game devices, music devices, video devices, and digital cameras.

5. Supplement

The preferred embodiments of the present disclosure have been described in detail above with reference to the accompanying drawings, but the technical scope of the present disclosure is not limited to such an example. It is obvious that persons of ordinary skill in the technical field of the present disclosure can conceive various modifications or alterations within the scope of the technical idea described in the claims, and it is of course understood that these also fall within the technical scope of the present disclosure.

Furthermore, the effects described in the present specification are merely descriptive or illustrative and not restrictive. That is, the technique according to the present disclosure can exhibit other effects obvious to those skilled in the art from the description in the present specification, in addition to or instead of the effects described above.

Note that the following configurations also belong to the technical scope of the present disclosure.

(1)

A magnetic memory including:

first and second tunnel junction elements each having a laminated structure including a reference layer with a fixed magnetization direction, a recording layer with a reversible magnetization direction, and an insulating layer sandwiched between the reference layer and the recording layer;

a first selection transistor electrically connected to first ends of the first and second tunnel junction elements;

a first wire electrically connected to a second end of the first tunnel junction element; and a second wire electrically connected to a second end of the second tunnel junction element.

(2)

The magnetic memory according to the (1), in which the first and second tunnel junction elements have magnetic characteristics substantially identical to each other.

(3)

The magnetic memory according to the (2), in which the first and second tunnel junction elements have shapes substantially identical to each other, and each layer of the first and second tunnel junction elements has a common material and a substantially identical film thickness between the first tunnel junction element and the second tunnel junction element.

(4)

The magnetic memory according to any one of the (1) to (3), further including:

a third tunnel junction element having the laminated structure; and a second selection transistor electrically connected to a first end of the third tunnel junction element, in which a second end of the third tunnel junction element is electrically connected to the second wire.

(5)

A magnetic memory including a plurality of memory cells arranged in a matrix, in which each of the memory cells includes:

a plurality of tunnel junction elements each having a laminated structure including a reference layer with a fixed magnetization direction, a recording layer with a reversible magnetization direction, and an insulating layer sandwiched between the reference layer and the recording layer;

a selection transistor electrically connected to first ends of the plurality of tunnel junction elements; and a plurality of wires electrically connected to a second end of each of the tunnel junction elements.

(6)

The magnetic memory according to the (5), in which two of the memory cells adjacent to each other share at least one of the wires.

(7)

The magnetic memory according to the (6), in which in the two of the memory cells adjacent to each other, the selection transistors are provided so as to share a source or a drain with each other.

(8)

A recording method of a magnetic memory, the magnetic memory including:

first and second tunnel junction elements each having a laminated structure including a reference layer with a fixed magnetization direction, a recording layer with a reversible magnetization direction, and an insulating layer sandwiched between the reference layer and the recording layer;

a selection transistor electrically connected to first ends of the first and second tunnel junction elements;

a first wire electrically connected to a second end of the first tunnel junction element; and a second wire electrically connected to a second end of the second tunnel junction element, the recording method including:

bringing the selection transistor into a conductive state; and providing a potential difference between the first wire and the second wire.

(9)

A recording method of a magnetic memory, the magnetic memory including a plurality of memory cells arranged in a matrix, each of the memory cells including:

a plurality of tunnel junction elements each having a laminated structure including a reference layer with a fixed magnetization direction, a recording layer with a reversible magnetization direction, and an insulating layer sandwiched between the reference layer and the recording layer;

a selection transistor electrically connected to first ends of the plurality of tunnel junction elements; and a plurality of wires electrically connected to a second end of each of the tunnel junction elements, the recording method including, in the memory cells:

bringing the selection transistor into a conductive state; and providing a potential difference between the plurality of wires.

(10)

The recording method of a magnetic memory according to the (9), further including, in the plurality of memory cells:

bringing a plurality of the selection transistors into a conductive state;

sequentially switching a voltage to be applied to the plurality of wires from a first voltage to a second voltage; and then sequentially switching the voltage to be applied to the plurality of wires from the second voltage to the first voltage.

(11)

A reading method of a magnetic memory, the magnetic memory including:

first and second tunnel junction elements each having a laminated structure including a reference layer with a fixed magnetization direction, a recording layer with a reversible magnetization direction, and an insulating layer sandwiched between the reference layer and the recording layer;

a selection transistor electrically connected to first ends of the first and second tunnel junction elements;

a first wire electrically connected to a second end of the first tunnel junction element;

a second wire electrically connected to a second end of the second tunnel junction element; and a third wire electrically connected to an opposite side of the selection transistor from the first and second tunnel junction elements, the reading method including:

bringing the selection transistor into a conductive state;

applying a voltage to the first and second wires so as to have a first polarity with respect to the third wire; and then applying a voltage to the first wire or the second wire so as to have a second polarity opposite to the first polarity with respect to the third wire.

REFERENCE SIGNS LIST

1 Magnetic memory
10, 10$a$ to $c$ Memory cell
100, 100$a$ to $f$ MTJ element
200 Underlayer
202 Reference layer
204 Insulating layer
206 Recording layer
208 Cap layer
300, 300$a$ to $c$ Selection transistor
400, 400$a$ to $d$ Word line
500, 500$a$ to $d$ Control line
600 Bit line
700 Node
800 Current-voltage conversion amplifier
900 Substrate
902 Source
904 Drain
906, 908 Contact via

The invention claimed is:

1. A magnetic memory, comprising:
a first tunnel junction element and a second tunnel junction element, wherein each of the first tunnel junction element and the second tunnel junction element has a laminated structure including:
a reference layer with a fixed magnetization direction;
a recording layer with a reversible magnetization direction; and
an insulating layer sandwiched between the reference layer and the recording layer;
a first selection transistor, wherein
a first terminal of the first selection transistor is electrically connected to a first end of the first tunnel junction element and a first end of the second tunnel junction element, and
a second terminal of the first selection transistor is electrically connected to a current-voltage conversion amplifier;
a first wire electrically connected to a second end of the first tunnel junction element; and
a second wire electrically connected to a second end of the second tunnel junction element.

2. The magnetic memory according to claim 1, wherein the first tunnel junction element and the second tunnel junction element have magnetic characteristics substantially identical to each other.

3. The magnetic memory according to claim 2, wherein
the first tunnel junction element and the second tunnel junction element have shapes substantially identical to each other,
each layer of the first tunnel junction element and the second tunnel junction element has a common material, and
each layer of the first tunnel junction element and the second tunnel junction element has a substantially identical film thickness.

4. The magnetic memory according to claim 1, further comprising:
a third tunnel junction element having the laminated structure; and
a second selection transistor electrically connected to a first end of the third tunnel junction element, wherein a second end of the third tunnel junction element is electrically connected to the second wire.

5. A magnetic memory, comprising:
a plurality of memory cells arranged in a matrix, wherein each of the plurality of memory cells includes:
a plurality of tunnel junction elements, each of the plurality of tunnel junction elements having a laminated structure including:
a reference layer with a fixed magnetization direction;
a recording layer with a reversible magnetization direction; and
an insulating layer sandwiched between the reference layer and the recording layer;
a selection transistor, wherein
a first terminal of the selection transistor is electrically connected to a plurality of first ends of the plurality of tunnel junction elements, and
a second terminal of the selection transistor is electrically connected to a current-voltage conversion amplifier; and
a plurality of wires electrically connected to a second end of each of the plurality of tunnel junction elements.

6. The magnetic memory according to claim 5, wherein two memory cells, of the plurality of memory cells, adjacent to each other share at least one of the plurality of wires.

7. The magnetic memory according to claim 6, wherein, in the two memory cells of the plurality of memory cells adjacent to each other, selection transistors share one of a source or a drain with each other.

8. A recording method of a magnetic memory,
the magnetic memory comprising:
a first tunnel junction element and a second tunnel junction element, wherein each of the first tunnel junction element and the second tunnel junction element has a laminated structure including:
a reference layer with a fixed magnetization direction;
a recording layer with a reversible magnetization direction; and
an insulating layer sandwiched between the reference layer and the recording layer;
a selection transistor, wherein
a terminal of the selection transistor is electrically connected to a first end of the first tunnel junction element and a first end of the second tunnel junction element;
a first wire electrically connected to a second end of the first tunnel junction element; and
a second wire electrically connected to a second end of the second tunnel junction element,
the recording method comprising:
bringing the selection transistor into a conductive state; and
providing a potential difference between the first wire and the second wire.

9. A recording method of a magnetic memory,
the magnetic memory comprising:
a plurality of memory cells arranged in a matrix, wherein each of the plurality of memory cells includes:
a plurality of tunnel junction elements, each of the plurality of tunnel junction elements having a laminated structure including:
a reference layer with a fixed magnetization direction;
a recording layer with a reversible magnetization direction; and
an insulating layer sandwiched between the reference layer and the recording layer;
a selection transistor, wherein
a terminal of the selection transistor is electrically connected to a plurality of first ends of the plurality of tunnel junction elements; and
a plurality of wires electrically connected to a second end of each of the plurality of tunnel junction elements,
the recording method comprising:
in the plurality of memory cells:
bringing the selection transistor into a conductive state; and
providing a potential difference between the plurality of wires.

10. The recording method of the magnetic memory according to claim 9, further comprising, in the plurality of memory cells:
bringing a plurality of selection transistors into the conductive state;
sequentially switching a voltage applied to each of the plurality of wires from a first voltage to a second voltage; and
subsequent to the sequential switch of the voltage from the first voltage to the second voltage, sequentially switching the voltage applied to each of the plurality of wires from the second voltage to the first voltage.

11. A reading method of a magnetic memory,
the magnetic memory comprising:
a first tunnel junction element and a second tunnel junction element, wherein each of the first tunnel junction element and the second tunnel junction element has a laminated structure including:
a reference layer with a fixed magnetization direction;
a recording layer with a reversible magnetization direction; and
an insulating layer sandwiched between the reference layer and the recording layer;
a selection transistor, wherein
a first terminal of the selection transistor is electrically connected to
a first end of the first tunnel junction element and a first end of the second tunnel junction element;
a first wire electrically connected to a second end of the first tunnel junction element;
a second wire electrically connected to a second end of the second tunnel junction element; and a third wire electrically connected to a second terminal of the selection transistor, the reading method comprising:

bringing the selection transistor into a conductive state;

applying a first voltage to the first wire and the second wire such that the first wire and second wire have a first polarity with respect to the third wire; and applying, subsequent to the application of the first voltage, a second voltage to one of the first wire or the second wire such that one of the first wire or the second wire has a second polarity, opposite to the first polarity, with respect to the third wire.

* * * * *